United States Patent
Steinwandel et al.

(10) Patent No.: US 6,180,189 B1
(45) Date of Patent: *Jan. 30, 2001

(54) METHOD AND APPARATUS FOR ALUMINUM NITRIDE COATING OF A CONTACT SURFACE, ESPECIALLY A CYLINDER CONTACT SURFACE OF A CRANKCASE MADE OF AN ALUMINUM BASIC ALLOY

(75) Inventors: Juergen Steinwandel, Oberuhldingen; Joerg Hoeschele, Friedrichshafen; Theodor Staneff, Bermatingen; Axel Heuberger, Wildberg-Gueltlingen, all of (DE)

(73) Assignee: DaimlerChrysler AG, Stuttgart (DE)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/065,421

(22) Filed: Apr. 24, 1998

(30) Foreign Application Priority Data

Apr. 26, 1997 (DE) .................................. 197 17 825

(51) Int. Cl.⁷ ........................ C23C 8/36; C23C 8/24; C23C 16/34; C23C 16/511; C23C 16/515

(52) U.S. Cl. ................. 427/535; 427/535; 427/569; 427/575; 427/239; 427/237; 427/309; 427/255.395; 427/255.4; 148/231

(58) Field of Search .................. 427/535, 255.4, 427/255.394, 569, 534, 309, 575, 239, 237; 148/231

(56) References Cited

U.S. PATENT DOCUMENTS

| | | |
|---|---|---|
| 4,244,751 | 1/1981 | Hioki et al. ........................ 148/1 |
| 4,309,227 | 1/1982 | Kajikawa et al. . |
| 4,522,660 | 6/1985 | Suzuki et al. . |
| 4,597,808 | 7/1986 | Tachikawa et al. . |
| 4,698,233 | 10/1987 | Ohira et al. . |
| 5,041,304 | * 8/1991 | Kusano et al. ........................ 427/41 |
| 5,093,150 | 3/1992 | Someno et al. . |
| 5,124,014 | * 6/1992 | Foo et al. ........................ 204/192.32 |
| 5,164,221 | 11/1992 | Someno et al. ........................ 427/575 |
| 5,352,494 | * 10/1994 | Rousseau ........................ 427/562 |
| 5,387,288 | * 2/1995 | Shatas ........................ 118/723 AN |
| 5,573,742 | 11/1996 | Gebhardt ........................ 423/412 |
| 5,637,150 | * 6/1997 | Wartski et al. ........................ 118/723 AN |
| 5,906,866 | * 5/1999 | Webb ........................ 427/534 |

FOREIGN PATENT DOCUMENTS

| | | |
|---|---|---|
| 151635 | * 10/1981 | (DE) . |
| 4106745 A1 | 9/1992 | (DE) . |
| 0346931 A2 | 12/1989 | (EP) . |
| 0574115 A2 | 12/1993 | (EP) . |
| 0 745 450 | 12/1996 | (EP) . |
| 62211365 | 9/1987 | (JP) . |
| 06279982A | 10/1994 | (JP) . |
| 8260126 | 10/1996 | (JP) . |

OTHER PUBLICATIONS

Abst. of Jap. JP 08–260126, pub. Oct. 1996, plus Derwent WPI Abstract.

* cited by examiner

Primary Examiner—Marianne Padgett
(74) Attorney, Agent, or Firm—Evenson, McKeown, Edwards & Lenahan, P.L.L.C.

(57) ABSTRACT

The invention relates to a method for aluminum nitride coating of cylinder contact surfaces (ZL) of a crankcase (KG) made of an aluminum basic alloy where the aluminum nitride coating is performed by surface nitriding of the aluminum basic alloy, and the activated nitrogen is generated by a high-pressure plasma process.

8 Claims, 2 Drawing Sheets

METHOD AND APPARATUS FOR ALUMINUM NITRIDE COATING OF A CONTACT SURFACE, ESPECIALLY A CYLINDER CONTACT SURFACE OF A CRANKCASE MADE OF AN ALUMINUM BASIC ALLOY

BACKGROUND AND SUMMARY OF THE INVENTION

This application claims the priority of German Patent Document 19717825.1, filed Apr. 26, 1997, the disclosure of which is expressly incorporated by reference herein.

The invention relates to a method for aluminum nitride coating, especially of a cylinder contact surface of a crankcase consisting of an aluminum basic alloy. The invention also relates to an apparatus for performing the method, as well as to a formed product.

In order to reduce static and moved masses and to realize fuel savings associated therewith, as well as to reduce pollutants, light metal alloys based on aluminum are being used increasingly in engine building. An example of reducing moved masses are the aluminum pistons which have been known for a long time. An example of reducing static masses is the use of light metal crankcases made of aluminum basic alloys, for example those of eutectic Al—Si materials, such as $Al_8Si$—Cu, made by injection molding.

Cylinder liners are often employed in such engines. At the present time, it is not possible to eliminate the casting of cylinder liners, even though this procedure is not fully satisfactory in all respects. First, the procedure results in a higher engine weight. Second, the connection between the cylinder liner and aluminum alloy represents a sensitive transition for transfer of heat into coolant ducts. If the problem is serious, it is possible for the cylinder liner to come loose, resulting in engine destruction.

In view of the problems mentioned above when cast cylinder liners are used in aluminum crankcases, one may conclude that the use of a sleeveless crankcase would be desirable; this cannot be achieved without additional measures taken with respect to the cylinder contact surface. First, aluminum basic material, in comparison with, for example, iron basic alloys, offers a lower hardness and poor wear resistance to the pistons. As a result, wear is greater, negatively affecting compression, oil stability and usage, and fuel consumption, and general long-term stability of the engine and engine parts such as the crankshaft end bearings. Second, the system composed of an aluminum crankcase and an aluminum piston does not represent a system with optimal tribological properties.

To make aluminum crankcases sleeveless, it is therefore necessary to modify the surface of the contact area by applying a coating with a chemical composition different from that of the aluminum base material which meets strength requirements and has optimal tribological properties. Moreover, the layer must also have satisfactory thermal conductivity values.

Use of a non-oxidic ceramic material, preferably aluminum nitride (AlN), would be advantageous because it would provide these necessary properties. AlN is a hard material that has a thermal conductivity that is comparatively high for ceramic materials. In addition, it has good tribological properties as far as the AlN layer/Al piston pair is concerned. By comparison, the formation of an oxide-ceramic layer, aluminum oxide-$Al_2O_3$ for example, has less favorable material properties. It is known that $Al_2O_3$ layers obtained by anodization cannot withstand the high alternating mechanical load to the degree and tend to break off.

As for mechanical load-bearing capacity, when AlN is used, comparatively thick layers in the range of at least several orders of $10 \times 10^{-6}$ m are required. With respect to coating technology and the anticipated application, this means a high-rate coating method should be employed, preferably a gas phase plasma process.

High application rates in plasma processes are known from the technically established plasma spray process. This is a typical thick-layer method in which a coating material provided in a powder form is melted, at least partially, in the plasma jet of a high-current arc discharge and then applied to a part at a comparatively high kinetic energy. The application of AlN coatings by this conventional plasma spray method is basically possible.

However, the method appears less suitable for the application of the present invention. First, the sprayed-on layer is not optimally anchored to the basic material. Second, a homogeneous material is not obtained. Both factors prove unsatisfactory for long-term resistance to the alternating mechanical loads that occur in the intended application.

In addition, there are problems with performing the process, as specially designed plasma spray heads are necessary for machining the cylinder bores.

Accordingly, the goal of the invention is to provide a method with which a layer, that is firmly anchored to the base material and homogeneous in structure, made of aluminum nitride (AlN) can be applied to an aluminum basic alloy ($AlSi_8Cu$, $AlSi_9Cu$, $AlSi_{10}Cu$ as near-eutectic alloys for example) especially for a crankcase housing in the vicinity of cylinder contact surfaces. With this method, the aluminum nitride layer can also be applied to predetermined contact path structures by means of a honing process. Additional aftertreatment should not be necessary. The method can be used not only in engine manufacturing but also in the repair of used devices.

According to the invention, AlN coating is produced by surface nitriding of the Al basic alloy. The activated nitrogen required for this purpose is produced by a high-pressure plasma process using molecular nitrogen.

Other objects, advantages and novel features of the present invention will become apparent from the following detailed description of the invention when considered in conjunction with the accompanying drawings.

DETAILED DESCRIPTION OF THE DRAWINGS

The methods described in the following examples employing high-pressure plasma generation are known to the individual skilled in the art and will be described only to the extent necessary for understanding the invention. For conventional general plasma physics, the term "high-pressure plasma" will be understood to mean that the plasma state is produced at working pressures above approximately 1 mbar with the pressure range being unlimited at the upper end. As a result of boundary conditions influencing manufacturing techniques, close to atmospheric working pressures are desirable, but this should not be understood as a limitation on the method according to the invention.

Figure 1:
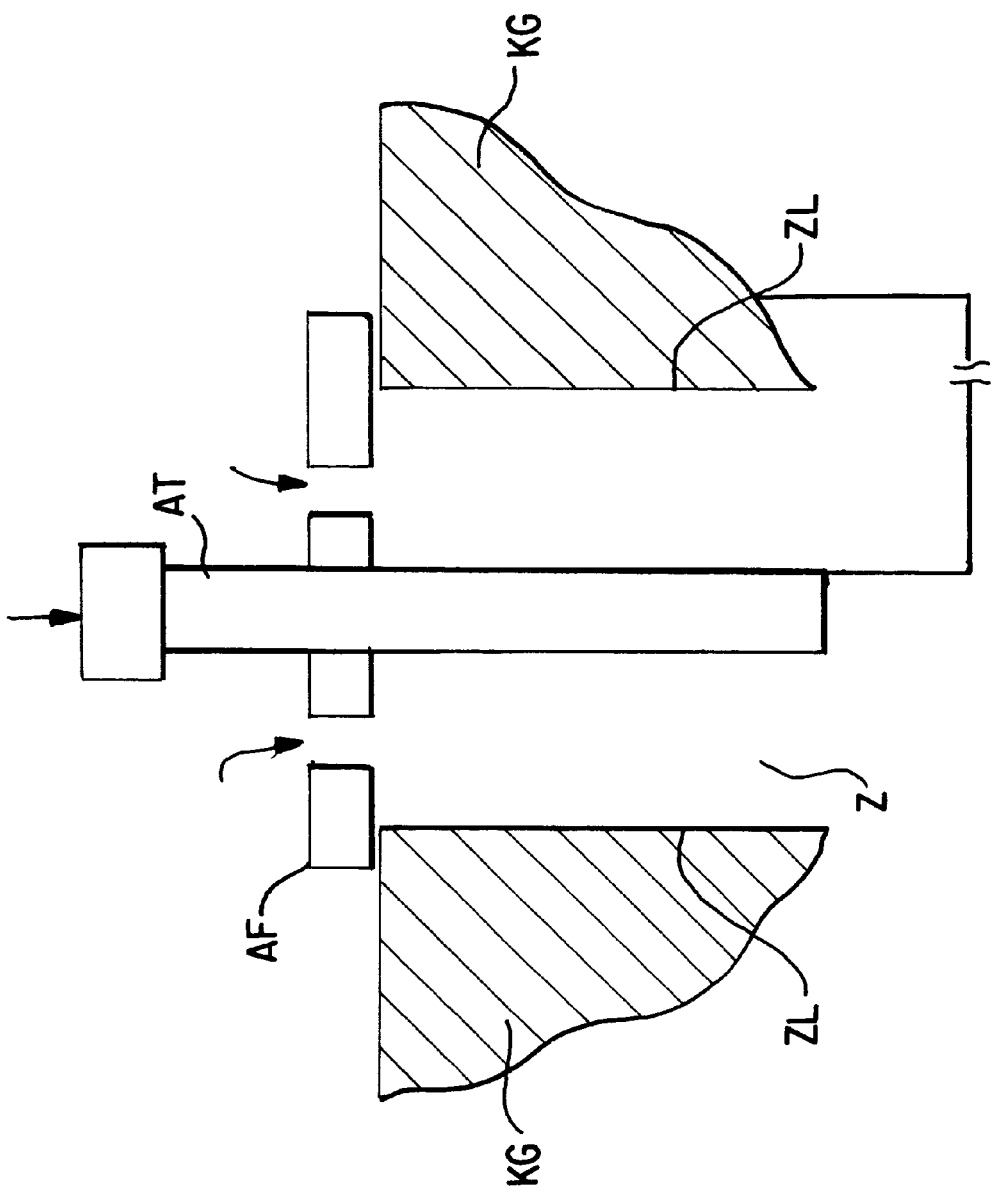
FIG. 1 shows a system for coating the cylinder contact surface of a crankcase by means of a microwave plasma discharge.

To coat the cylinder contact surfaces ZL of crankcase KG, a high-pressure plasma is generated in cylinder bore Z of crankcase KG with the system shown in FIG. 1 using microwave energy. The microwave radiation is generated by a magnetron, not shown here, and guided by a hollow waveguide or coaxial cable into the crankcase KG. MW coupling is advantageously accomplished by means of a coupling antenna AT at the technically established frequencies of 0.915 GHz and 2.46 GHz. The choice of these frequencies is governed exclusively by the availability of suitable MW components. Other frequencies in the microwave band may be used as well. For a greater range of variation in plasma parameters, there is also an overlap of a steady-state or pulsed electrical field with the radial preferred direction of the electrical field vectors. The process gases are admitted through an opening in a cover flange AF mounted on the end of cylinder bore Z.

Figure 2:
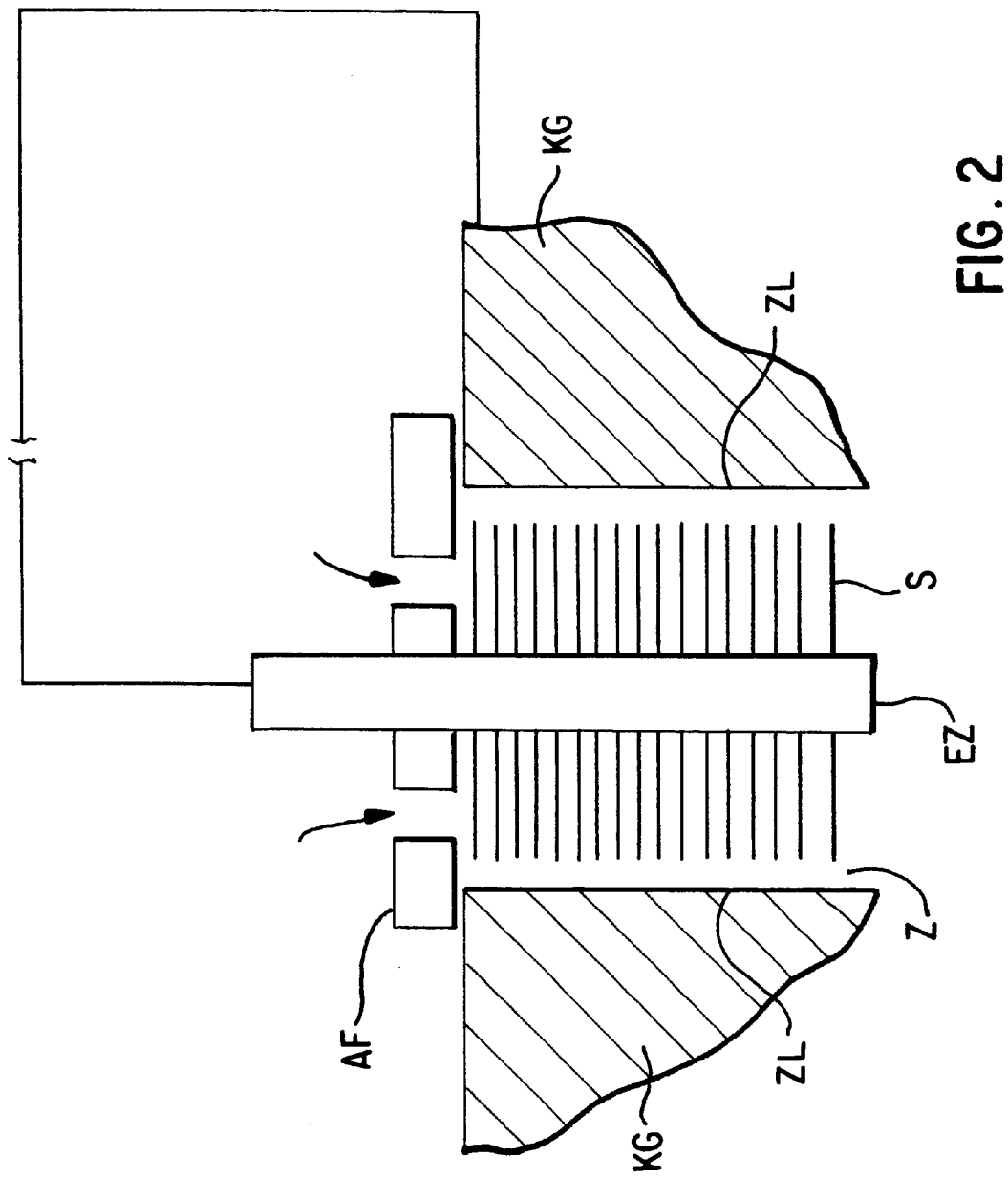
FIG. 2 shows a system for coating the cylinder contact surface of a crankcase using a corona or barrier discharge.

According to the system shown in FIG. 2, a high-pressure plasma is generated in cylinder bore Z of the crankcase by means of a corona or barrier discharge. A central electrode EZ is introduced into cylinder bore Z. with additional spray disks S arranged on said electrode shown. The spray disks are preferably made with sharply tapering edges, resulting in high electrical field gradients and thus a high field emission probability for electrons. A high electrical voltage is applied between central electrode EZ and crankcase KG that serves as the counterelectrode. The discharges can be steady-state and/or pulsed, with the pulsed discharges allowing a greater range of variation in plasma parameters.

Although the plasma discharges described in FIGS. 1 and 2 are generated by different physical processes, the plasma processes are those employed in the embodiment described below.

For anchoring the AlN layer in the base material, the natural oxide cover layer of the Al base alloy, which consists essentially of $Al_2O_3$ and $SiO_2$, can be removed in a first method step. A reductive gas-solid process is employed for the purpose and uses hydrogen, as described below. It should be noted in this situation that molecular hydrogen cannot be used to reduce the relevant oxides because of chemical and thermodynamic restrictions. Instead, atomic hydrogen is required, which can be produced from molecular hydrogen by sufficiently energy-rich plasma discharges. The relevant reactions can be expressed as follows:

$$3H_2 = 6H \text{ (plasma reaction)} \tag{1}$$

$$Al_2O_3 + 6H = 2Al + 3H_2O \tag{2}$$

Molecular hydrogen can be used as a pure gas or in the form of working gases that contain diatomic hydrogen, used as, for example, the forming gas of molecular hydrogen (such as nitrogen with a variable hydrogen content, usually about 70 to 95% $N_2$, and the remainder being $H_2$).

By removing the natural oxide layer, the reactivity of the basic material for nitriding is increased, or nitriding itself is made possible as a result. Nitriding of the base material in this connection means forming stoichiometric mixtures of AlN and $Si_3N_4$ in the surface of the basic material.

Surface nitriding is accomplished by switching to pure nitrogen as the process gas, possibly after removing the natural oxide layer. Assuming sufficiently high plasma energies, activated nitrogen is obtained, which is understood to be a mixture of nitrogen atoms and in particular electronically excited nitrogen molecules. The following equations apply:

$$N_2 = 2N \tag{3}$$

$$N_2 = (N2)^* \tag{4}$$

The activated nitrogen has a much higher diffusion probability in the base material than nonactivated molecular nitrogen does. This results in increased reactivity relative to nitride formation in the surface of the basic material. The layer thickness of the surface AlN layer is preferably $5-20 \times 10^{-6}$ m In applications in which the thickness of the surface nitride layer is not sufficiently great, a pure AlN layer is applied to the surface nitride layer in another method step. The layer thickness of the pure AlN layer is approximately $5-10 \times 10^{-6}$ m The reactive components are activated in a reactive high-pressure plasma process. For this, an aluminum-containing process gas in concentrations up to the maximum stoichiometric value for AlN formation is added to the pure nitrogen from the nitriding process. An example is the use of aluminum trimethyl. It is also possible to use aluminum chloride which can be obtained in the gas phase by sublimation of the solid. In both cases, the reaction probability can be increased by adding hydrogen. The corresponding reactions are written as follows:

$$Al(CH_3)_3 + 1/2 N_2 + 3/2 H_2 = AlN(gas) + HC_4 \tag{5}$$

$$xAlN(gas) = (AlN)_x(layer) \tag{6}$$

and $$AlCl_3(gas) + 1/2 N_2 + 3/2 H_2 = (AlN)gas + 3HCl \tag{7}$$

$$xAlN(gas) = (AlN)_x(layer) \tag{8}$$

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for aluminum nitride coating of cylinder contact surfaces of a crankcase made of an aluminum based alloy, comprising the steps of:

creating activated nitrogen from molecular nitrogen with a plasma at atmospheric pressure; and surface nitriding the aluminum based alloy with the activated nitrogen in a symmetric cylindrical configuration, thereby creating a homogeneous surface AlN layer, wherein the plasma is generated by coupling microwaves from an antenna that extends axially inside the crankcase.

2. The method according to claim 1, further comprising depositing an additional AlN layer on the surface AlN layer by means of a reactive high-pressure plasma process using nitrogen and gaseous compounds of Al.

3. The method according to claim 2, wherein the reactive high pressure plasma employs hydrogen in addition to the nitrogen and gaseous compounds of Al.

4. The method according to claim 2, wherein the gaseous compounds of Al is aluminum chloride or aluminum trimethyl.

5. The method according to claim 1, further comprising removing a natural oxide layer on the aluminum basic alloy prior to surface nitriding by a reductive gas-solid process using atomic hydrogen.

6. The method according to claim 1, wherein a static or alternating electrical field is superimposed on a microwave field in the radial direction perpendicular to the antenna axis.

7. A method for aluminum nitride coating of cylinder contact surfaces of a crankcase made of an aluminum based alloy, comprising the steps of:

creating activated nitrogen from molecular nitrogen with a plasma at atmospheric pressure; and surface nitriding the aluminum based alloy with the activated nitrogen in a symmetric cylindrical configuration, thereby creating a homogeneous surface AlN layer, wherein the plasma is generated by a static corona or barrier discharge from a central electrode that extends axially inside the crankcase.

8. A method for aluminum nitride coating of cylinder contact surfaces of a crankcase made of an aluminum based alloy, comprising the steps of:

creating activated nitrogen from molecular nitrogen with a plasma at atmospheric pressure; and surface nitriding the aluminum based alloy with the activated nitrogen in a symmetric cylindrical configuration, thereby creating a homogeneous surface AlN layer, wherein the plasma is generated by a pulsed corona or barrier discharge from a central electrode that extends axially inside the crankcase.

* * * * *